United States Patent
Lam

(10) Patent No.: US 7,678,618 B2
(45) Date of Patent: Mar. 16, 2010

(54) METHODS USING DIE ATTACH PADDLE FOR MOUNTING INTEGRATED CIRCUIT DIE

(75) Inventor: Ken M. Lam, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/941,234

(22) Filed: Nov. 16, 2007

(65) Prior Publication Data

US 2008/0064145 A1    Mar. 13, 2008

Related U.S. Application Data

(62) Division of application No. 10/965,653, filed on Oct. 13, 2004, now Pat. No. 7,323,765.

(51) Int. Cl.
*H01L 31/0203* (2006.01)

(52) U.S. Cl. .................. 438/123; 257/666; 257/669; 257/674; 257/E23.031; 257/E23.037

(58) Field of Classification Search .......... 257/676, 257/782, 784, E23.003, E23.006, E23.02, 257/E23.037, E23.043, 666, 669, 674, E23.031; 438/123

See application file for complete search history.

(56) References Cited

U.S. PATENT DOCUMENTS

| | | | |
|---|---|---|---|
| 4,771,330 A | | 9/1988 | Long |
| 4,942,455 A | * | 7/1990 | Shinohara .................. 257/666 |
| 5,157,480 A | | 10/1992 | McShane et al. |
| 5,168,368 A | | 12/1992 | Gow, 3rd et al. |
| 5,196,992 A | * | 3/1993 | Sawaya ....................... 361/736 |
| 5,399,904 A | | 3/1995 | Kozono |
| 5,512,781 A | | 4/1996 | Inoue |

(Continued)

FOREIGN PATENT DOCUMENTS

WO    WO 06044061 A2    4/2006

(Continued)

OTHER PUBLICATIONS

"U.S. Appl. No. 11/941,257, Non-Final Office Action mailed Jun. 25, 2008", 9 pgs.

(Continued)

*Primary Examiner*—Davienne Monbleau
*Assistant Examiner*—Eduardo A Rodela
(74) *Attorney, Agent, or Firm*—Schwegman, Lundberg & Woessner, P.A.

(57) ABSTRACT

An electrical package for an integrated circuit die which comprises a die-attach paddle for mounting the integrated circuit die. The die-attach paddle has at least one down-set area located on a periphery of the die-attach paddle. The down-set area has an upper surface and a lower surface, with the upper surface configured to electrically couple a first end of a first electrically conductive lead wire. A second end of the first electrically conductive lead wire is bonded to the integrated circuit die. The upper surface is further configured to electrically couple a first end of a second electrically conductive lead wire and a second end of the second electrically conductive lead wire is bonded to a lead finger of the electrical package.

22 Claims, 6 Drawing Sheets

U.S. PATENT DOCUMENTS

| | | | |
|---|---|---|---|
| 5,804,468 | A | 9/1998 | Tsuji et al. |
| 6,313,519 | B1 | 11/2001 | Gainey et al. |
| 6,388,311 | B1 | 5/2002 | Nakashima et al. |
| 6,577,019 | B1 | 6/2003 | Roberts et al. |
| 6,603,195 | B1 | 8/2003 | Caletka et al. |
| 6,713,852 | B2 | 3/2004 | Abbott et al. |
| 6,818,973 | B1 | 11/2004 | Foster |
| 6,908,843 | B2 | 6/2005 | Baldonado et al. |
| 6,998,702 | B1 | 2/2006 | Zwenger et al. |
| 7,323,765 | B2 | 1/2008 | Lam |
| 2002/0149099 | A1 | 10/2002 | Shirasaka et al. |
| 2003/0015780 | A1 | 1/2003 | Kang et al. |
| 2003/0205795 | A1 | 11/2003 | Roberts et al. |
| 2008/0061416 | A1 | 3/2008 | Lam |

FOREIGN PATENT DOCUMENTS

| | | | |
|---|---|---|---|
| WO | WO 06044061 A3 | 4/2006 | |

OTHER PUBLICATIONS

"U.S. Appl. No. 11/941,257, Notice of Allowance mailed Dec. 31, 2008", 6 pgs.

"U.S. Appl. No. 11/941,257, Response filed Sep. 25, 2008 to Non-Final Office Action mailed Jun. 25, 2008", 7 pgs.

"International Application Serial No. PCT/US05/32386 Search Report mailed Jul. 1, 2008", 3 pages.

"International Application Serial No. PCT/US05/32386 Written Opinion mailed Jul. 1, 2008", 6 pages.

"Production Leadframes", *Printout: Simtek Corporation*, (Sep. 2002), 6 pgs.

"U.S. Appl. No. 11/941,257, Notice of Allowance mailed Aug. 12, 2009", 7 PGS.

\* cited by examiner

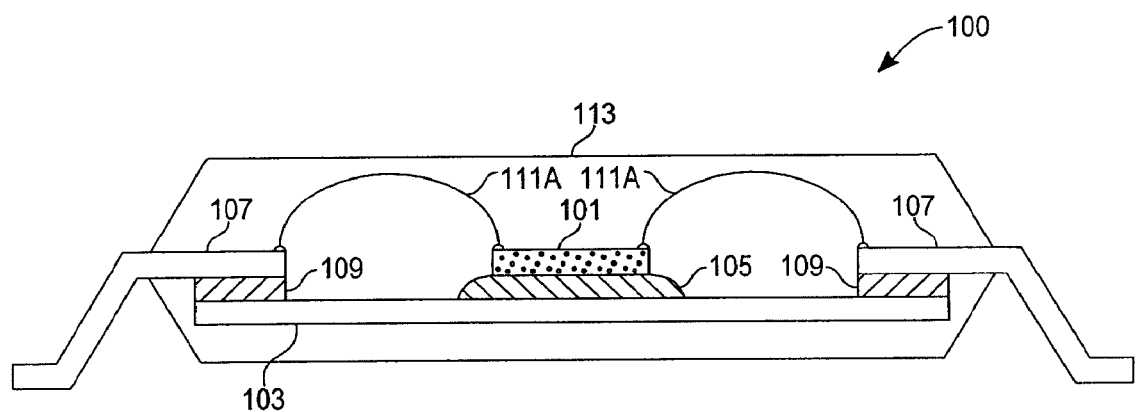
*Fig._1A (Prior Art)*
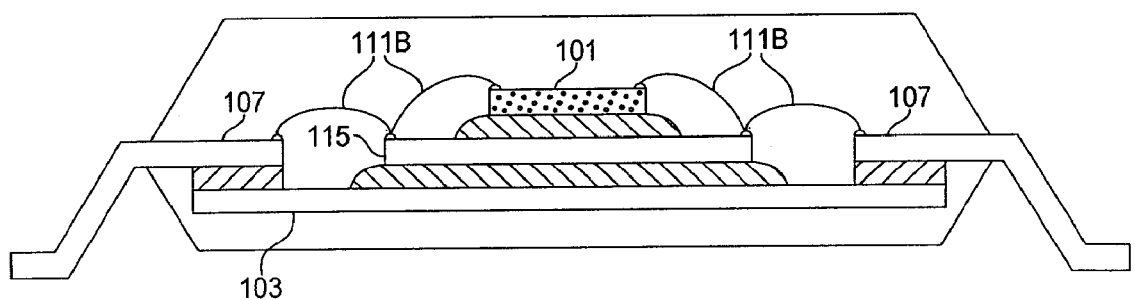
*Fig._1B (Prior Art)*

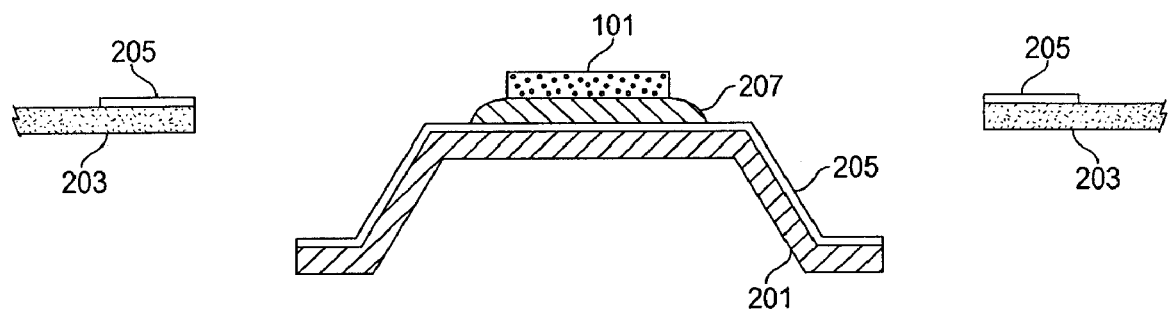
Fig._2
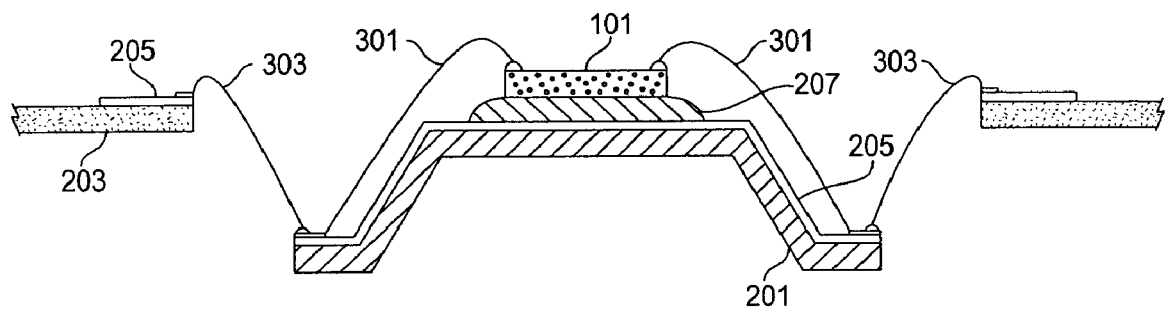
Fig._3

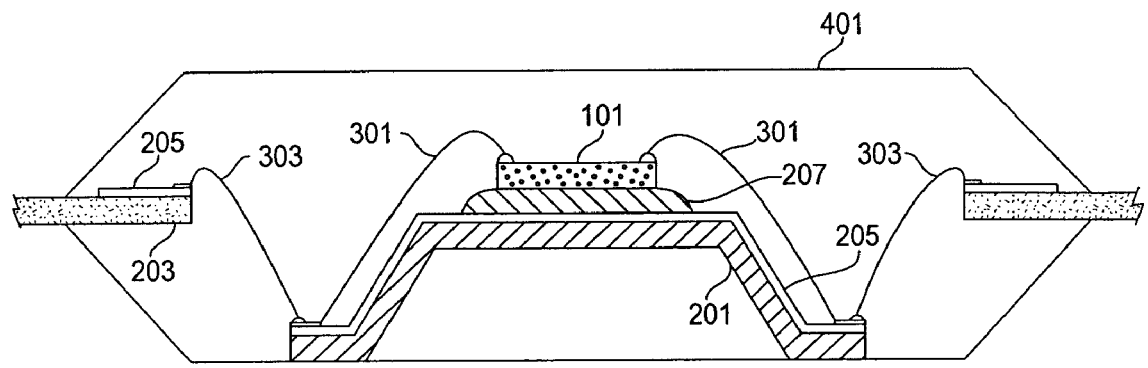
Fig._4
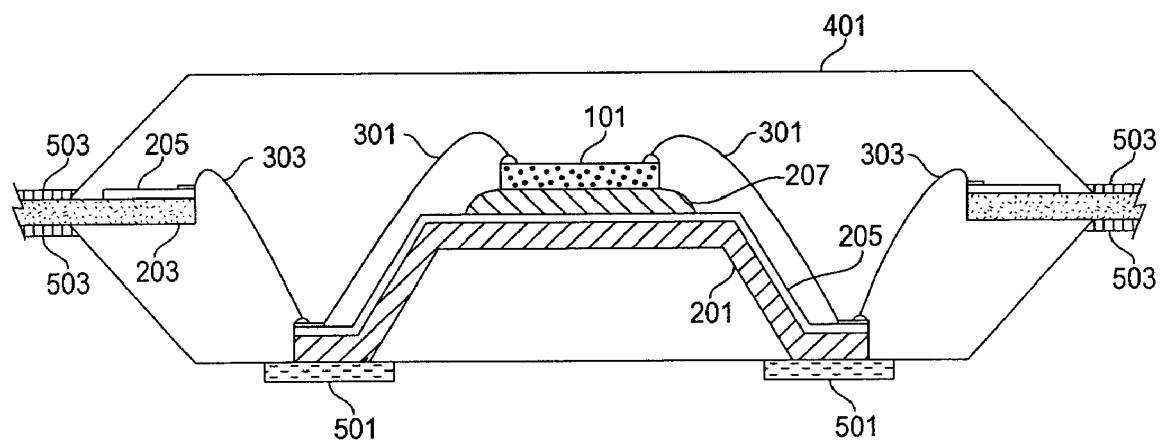
Fig._5

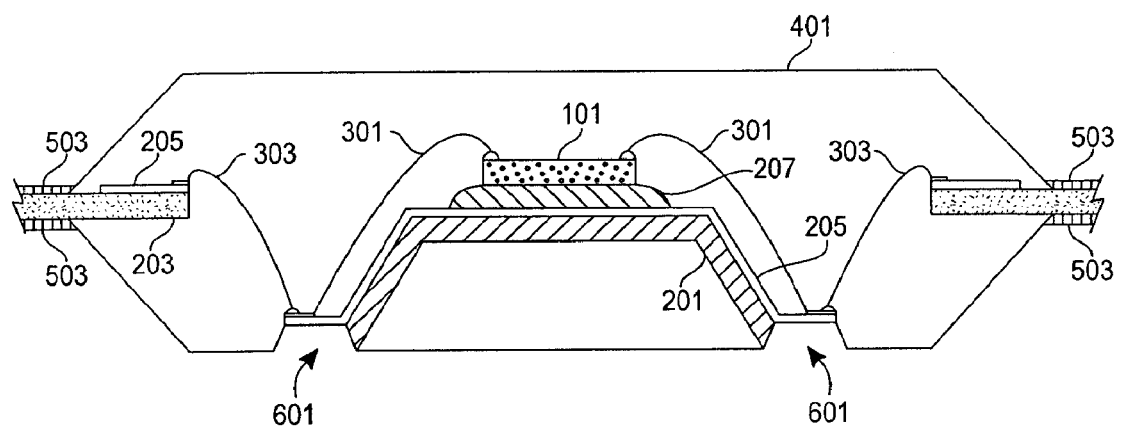
Fig._6
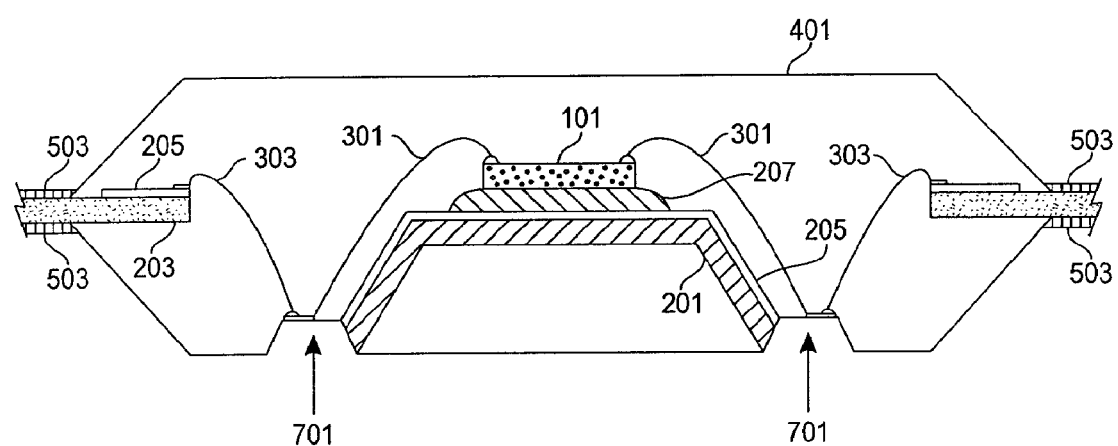
Fig._7

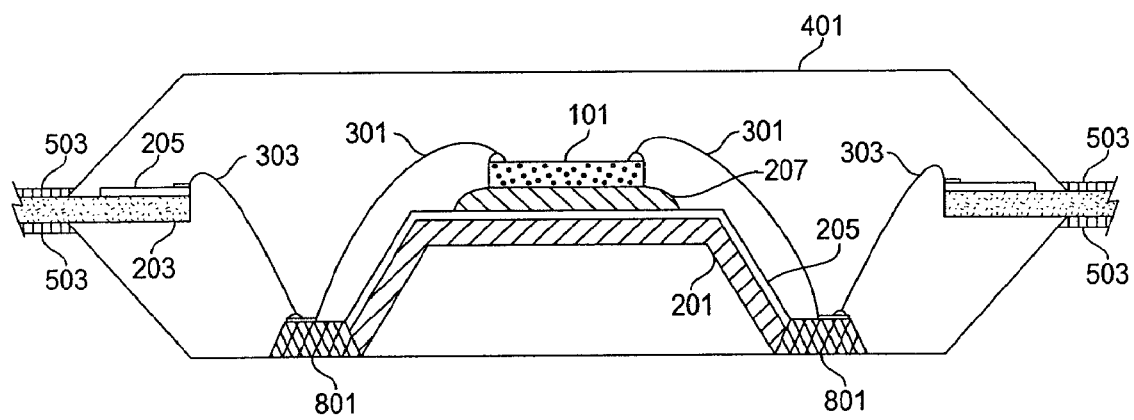
Fig. _ 8

METHODS USING DIE ATTACH PADDLE FOR MOUNTING INTEGRATED CIRCUIT DIE

CROSS-REFERENCE TO RELATED APPLICATION

This application is a divisional of and claims the benefit of priority from U.S. patent application Ser. No. 10/965,653, filed Oct. 13, 2004, now U.S. Pat. No. 7,323,765, which is hereby incorporated by reference.

TECHNICAL FIELD

The present invention relates to packaging of semiconductor integrated circuits. More particularly, the present invention relates to a device and method for preventing electrical shorts between lead wires in integrated circuit packaging.

BACKGROUND ART

As integrated circuit fabrication technology advances, the physical size of an integrated circuit device becomes progressively smaller. A given wafer size can now produce more integrated circuit devices per wafer without increasing a cost of wafer fabrication. One group of technical disciplines is aimed at packaging the devices. As devices become more complex and need to be integrated with additional devices, a universal interconnection scheme becomes more difficult.

Typically, a semiconductor device has fixed input/output (I/O) lines and interconnection with an external package can be difficult. This difficulty may lead to a redesign of an entire integrated circuit to avoid long lead wires from the device to the package. Additionally, any lead lines that cross over each other have a potential for developing an electrical short. Therefore, the interconnection of semiconductor devices with device packages is a major challenge in the art.

The integrated circuit devices are mounted on a surface of a mounting substrate and layers of interconnect lines and vias are formed that connect the devices to surrounding circuitry. Many different packaging approaches are known and have been used for mounting and interconnecting semiconductor devices, such as Dual-In-Line Packages (DIP), Pin Grid Arrays (PGA), Plastic Leaded Chip Carriers (PLCC) and Quad Flat Packages (QFP).

A maximum allowable bond wire length in package assembly is typically in a 3.8 mm-4.6 mm (150 mil-180 mil) range. However, with a smaller integrated circuit die size, a distance between the die on the package lead bond post increases since the standard packages tend to remain the same size. This increase in distance between the integrated circuit package and the integrated circuit die can sometimes result in wire leads in excess of 5 mm (200 mil) or more. This long lead length can create assembly defects of wire-sweep during a molding operation resulting in potential electrical shorts between adjacent lead wires.

Currently, one solution is to convert the package into a stack-die configuration. In this case, a bottom die has metal pads patterned to be used as "jumper" pads. A lead wire would be bonded from a top integrated circuit die onto the bottom jumper die and then, in turn, to the package lead. This breaks up the long wire into two shorter segments. However, this solution also requires design and fabrication of the jumper die. The jumper die, together with a stack die assembly, is a significant cost to a final assembled package.

FIG. 1A shows a cross-section of a typical integrated circuit die 101 mounted into a lead frame package 100 (for example, a QFP). The lead frame package 100 includes a die-attach pad 103, die-attach adhesive 105, a plurality of lead frames 107, electrically-insulating adhesive 109, and a plurality of wire leads 111A. Once the plurality of bond wire leads 111A are connected from the integrated circuit die 101 to the plurality of lead frames 107, a mold compound 113 is used to encapsulate and complete the lead frame package 100.

FIG. 1B shows a bottom jumper die 115. A plurality of bond wire leads 111B are connected from the integrated circuit die 101 to the bottom jumper die 115 and then to the plurality of lead frames 107, thus eliminating overly long bond wires.

An integrated circuit die, for example, a logic die, with 700 circuits and three layers of wiring has approximately 5 m of aluminum wiring on a chip less than 5 mm square. There are over 17,000 via connections from level to level through an insulator film of $SiO_2$. Yet, the conductor capacity in the die greatly lags behind the densification of the silicon devices. Most of the area of the die (approximately two-thirds), still serves as a platform for wiring.

Therefore, what is needed is a is way to provide for flexible wiring techniques between semiconductor devices and packages while avoiding problems associated with long lead lines and potentially shorted devices. Additionally, a universal package which may be used with a variety of different semiconductor devices is desirable.

DISCLOSURE OF THE INVENTION

The present invention eliminates the problem with long lead wires and jumper dice by forming a down-set area on a die-attach paddle to which lead wires may be bonded prior to being connected to lead fingers (i.e., the electrical "pins" of, for example, a quad flat pack) of the electrical package. The die-attach paddle is an apparatus onto which an integrated circuit die is mounted prior to a commencement of wire bonding operations. The present invention therefore comprises a die-attach paddle for mounting the integrated circuit die. The die-attach paddle has at least one down-set area located on a periphery of the die-attach paddle. The down-set area has an upper surface and a lower surface, with the upper surface configured to electrically couple a first end of a first electrically conductive lead wire. A second end of the first electrically conductive lead wire is bonded to the integrated circuit die. The upper surface is further configured to electrically couple a first end of a second electrically conductive lead wire and a second end of the second electrically conductive lead wire is bonded to a lead finger of the electrical package.

The present invention is also a method for attaching an integrated circuit die to an electrical package. The method comprises forming a down-set on a periphery of a die-attach paddle and adhering the integrated circuit die to an uppermost portion of the die-attach paddle. A first end of a first lead wire is bonded to the integrated circuit die and the second end of the first lead wire is bonded to the down-set portion of the die-attach paddle. A first end of a second lead wire is bonded to the down-set portion of the die-attach paddle and a second end of the second lead wire is bonded to a lead finger of the electrical package. The integrated circuit die and die-attach paddle are then encapsulated with, for example, an epoxy molding compound. Optionally, if the down-set area of the die-attach paddle is configured so as to provide an electrical path between lead wires, any exposed lowermost section of the down-set portion of the die-attach paddle is masked after encapsulation. Exposed areas of the lead fingers are then plated with an electrically conductive material. After plating, the lowermost section of the down-set portion of the die-attach paddle is then unmasked and a lower section of the down-set portion of the die-attach paddle is removed with a chemical etchant. Additionally, any conductive material plated onto an uppermost surface of the down-set area is removed by chemical etching. Any void left by removing the conductive material and the lower section of the down-set portion of the die-attach paddle is then filled with epoxy.

BRIEF DESCRIPTION OF THE DRAWINGS

FIG. 1A is a cross-section of a prior art integrated circuit package.

FIG. 1B is a cross-section of a prior art integrated circuit package incorporating a jumper die.

FIG. 2 is a cross-section of an exemplary embodiment of the present invention showing the die paddle down-set.

FIG. 3 is the die paddle down-set of FIG. 2 showing bond wire leads attached.

FIG. 4 is the die paddle down-set of FIG. 3 after encapsulation.

FIG. 5 is the die paddle down-set of FIG. 4 incorporating a temporary mechanical mask to prevent plating onto an exposed area of the down-set.

FIG. 6 is the die paddle down-set of FIG. 5 after removal of the temporary mechanical mask and etching of the exposed area of the down-set.

FIG. 7 is the die paddle down-set of FIG. 6 after an etch of exposed plating.

FIG. 8 is the die paddle down-set of FIG. 7 after performing a void filler operation.

MODES FOR CARRYING OUT THE INVENTION

Figure 9:
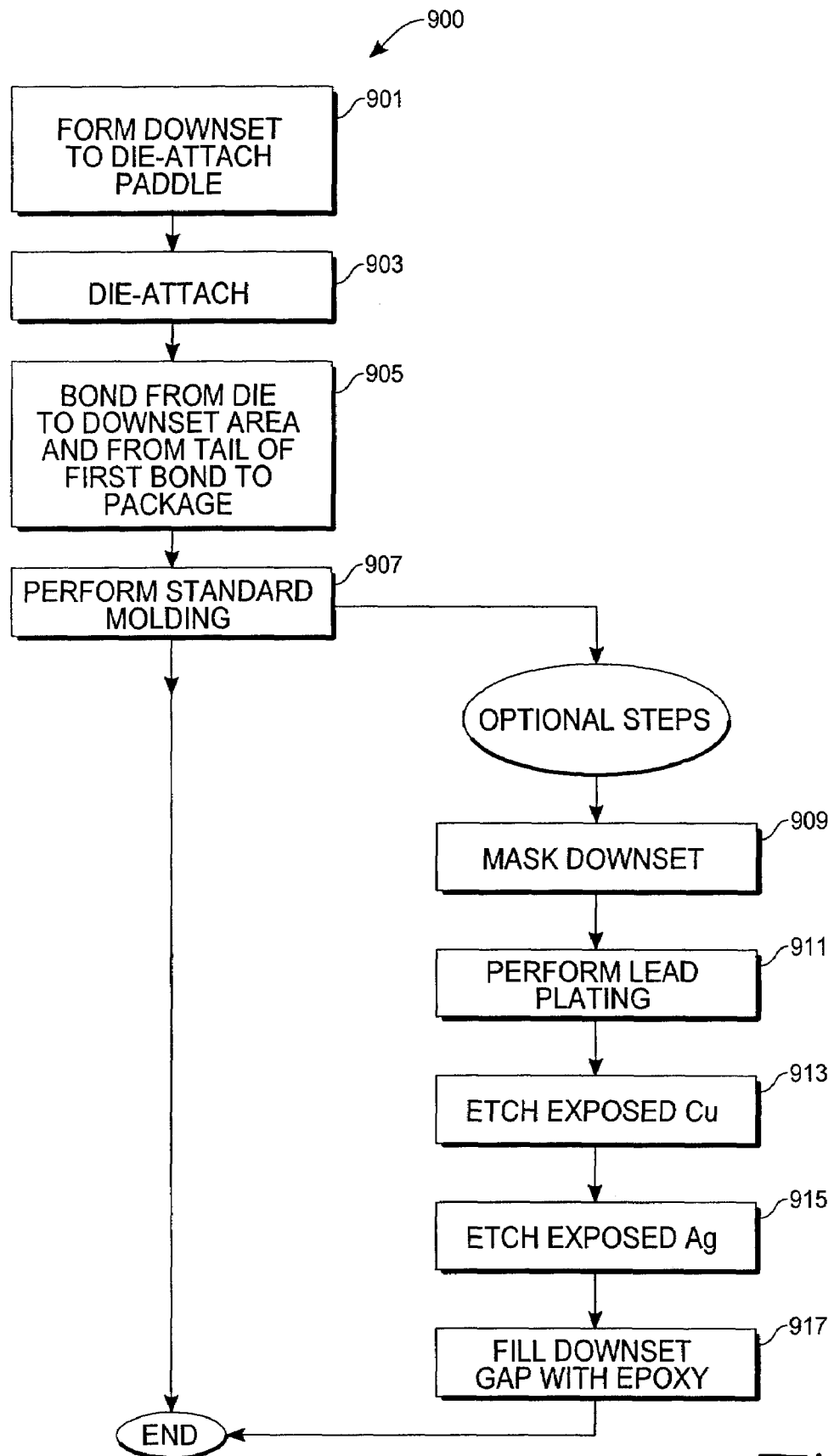
FIG. 9 is an exemplary flowchart for a method of mounting an integrated circuit into an electrical package of the present invention.

The present invention will now be described with reference to preferred embodiments thereof. With reference to FIG. 2, a down-set is formed on a periphery of a die-attach paddle 201. A section of a lead finger 203 is used to electrically couple the integrated circuit die 101 to other parts of a printed circuit board (not shown). A typical material used for fabrication of the die-attach paddle 201 and lead finger 203 is copper, although other materials may readily be employed. An uppermost surface of both the die-attach paddle 201 and the lead finger 203 is plated with a conductive material 205. In one specific embodiment, the conductive material 205 is silver. Alternatively, another noble metal, such as gold or platinum, may be used for the conductive material 205 provided that the conductive material 205 and the bond wire material, described infra, are dissimilar. The integrated circuit die 101 is mechanically fastened to the die-attach paddle 201 through the use of a suitable adhesive 207.

In FIG. 3, a bond wire 301 is attached from the integrated circuit die 101 to the down-set portion of the die-attach paddle 201. A second bond wire 303 is in electrical communication with the tail of the first bond wire 301 and is attached from the down-set portion of the die-attach paddle 201 to the conductive material 205 on the lead finger 203. This arrangement of running the bond wire 301 from the integrated circuit die 101 to the down-set portion of the die-attach paddle 201 and then to the lead finger 203 eliminates a single long lead by breaking the lead wire path into two shorter segments. The shorter segments are unlikely to be able to short together with other bond wire segments (not shown).

Wire bonding techniques are well-known in the industry and are used to attach fine lead wires, typically 25 μm to 75 μm (1 mil-3 mil) in diameter, from one bond pad to another to complete an electrical connection in electronic devices. Lead wires are frequently made of gold, aluminum, silver, or copper. Contemporary methods of wire bonding include wedge bonding and ball bonding. Both methods utilize thermocompression, ultrasonic, and/or thermosonic techniques.

A mold compound forms an encapsulated area 401 (FIG. 4) around the lead wire bonded die-attach paddle 201 and lead finger 203. Notice that the encapsulated area 401 leaves a lowermost portion of the down-set area of the die-attach paddle 201 exposed for later processing (to be described, infra).

With respect to FIG. 5, a plating operation (e.g., standard tin-lead or pure tin) serves to provide a plated area 503 adhered to the lead finger 203 for subsequent soldering of a completed integrated circuit package to a printed circuit board. A mechanical mask 501 prevents plating from attaching to a lower-most section of the down-set portion of the die-attach paddle 201. The mechanical mask 501 may be virtually any material capable of standing the plating operation and which can be readily removed after the plating operation is complete. After plating, the mechanical mask 501 is removed.

A chemical etchant is subsequently used to remove the lower-most section of the down-set portion of the die-attach paddle 201 (FIG. 6). For example, if copper is used to construct the die-attach paddle 201, a copper etchant will effectively remove an exposed area of the die-attach paddle 201, leaving a void 601. Notice that, in this example, the copper etchant does not etch the plated area 503, nor does it etch the conductive material 205. An additional chemical etchant step is used to remove a lower-most portion of the conductive material 205, leaving a larger void 701 (FIG. 7). Notice that the tail and head of the bond wires 301, 303 are in full electrical communication with each other. However, the bond wire 301, 303 pair which was previously in electrical communication with all other pairs of bond wires (not shown) through an electrical coupling provided by the die-attach paddle 201, are now electrically isolated from all other bond wire pairs.

Finally, with reference to FIG. 8, a nonconductive liquid epoxy 801 is used to fill the void 701 left by the chemical etching steps.

The exemplary flowchart 900 of FIG. 9 begins with forming 901 a down-set on a die-attach paddle. The down-set may be applied to one or more edges of a die-attach paddle. Alternatively, the down-set area of the die-attach paddle may have individual legs (i.e., one leg for each wire bond pair) which are electrically isolated from each other. In this case, chemical etching of lower portions of the down-set legs would be necessary.

An integrated circuit die is then attached 903 to an uppermost portion of the die-attach paddle and lead wires are bonded 905 from the die to the down-set area and from the tail of the first lead wire to one or more lead fingers. Standard molding procedures are then employed 907 to encapsulate the die, die-attach paddle, lead wires, and portions of the lead fingers.

If the down-set area of the die-attach paddle incorporates individual, electrically isolated legs, described supra, the process is complete. If, however, a standard die-attach paddle comprising an electrically conductive material is used, optional steps are employed to electrically isolate each of the sets of wire bond pairs from one another. These optional steps include masking 909 a lower-most portion of the down-set area, performing lead plating 911 (e.g., plating leads with tin-lead or pure tin), etching 913 (e.g., chemically or mechanically etching copper used to construct the die-attach paddle) a lower-most portion of the down-set area, etching 915 (e.g. chemically or mechanically etching) any conductive plating material (e.g., silver) that was used on the die-attach paddle, and filling 917 any down-set void created by the etching processes with filler material (e.g., epoxy).

Although the detailed description and drawings describe a universal interconnect die and applications of the same, one skilled in the art will recognize that other embodiments can readily be contemplated without departing from an intended scope of the present invention described. For example, although the die-attach paddle 201 (FIG. 2) and the conductive material 205 plated thereon are shown as two separate materials for sake of clarity, one skilled in the art can readily envision a single material which may serve both purposes. Therefore, a method of fabrication of the present invention would change accordingly. Thus, the fabrication process described herein is merely exemplary. Other techniques and materials (e.g., laminates or ceramics) may be readily employed and still be within a scope of the present invention. Further, a skilled artisan will recognize that the lead wire bond pairs need not be individual wires, but may simply be one continuous wire in which a center portion of the wire is bonded to an uppermost portion of the down-set area of the die-attach paddle.

What is claimed is:

1. A method for attaching an integrated circuit die to an electrical package, comprising:
    adhering the integrated circuit die to an uppermost portion of a die-attach paddle;
    bonding a first lead wire from the integrated circuit die to a down-set portion of the die-attach paddle at a periphery thereof;
    bonding a second lead wire from the down-set portion to a lead finger of the electrical package; and
    encapsulating the integrated circuit die and the die-attach paddle, leaving a section of the down-set portion exposed.

2. The method of claim 1 further comprising plating an uppermost portion of the die-attach paddle with an electrically conductive material.

3. The method of claim 1, comprising etching a lower section of the down-set portion of the die-attach paddle.

4. The method of claim 3, comprising etching a plated conductive material from an uppermost surface of the down-set portion.

5. The method of claim 4, comprising filling, with epoxy, a void left by removing the conductive material and the lower section of the down-set portion of the die-attach paddle.

6. A method for attaching an integrated circuit die to an electrical package comprising:
    adhering the integrated circuit die to an uppermost portion of a die-attach paddle, the die-attach paddle being selected to have a down-set portion on a periphery of the die-attach paddle;
    bonding a first lead wire from the integrated circuit die to the down-set portion of the die-attach paddle;
    bonding a second lead wire from the down-set portion of the die-attach paddle to a lead finger of the electrical package;
    encapsulating the integrated circuit die and the die-attach paddle;
    masking a lowermost section of the down-set portion of the die-attach paddle;
    plating an exposed area of the lead finger;
    unmasking the lowermost section of the down-set portion of the die-attach paddle;
    removing a lower section of the down-set portion of the die-attach paddle with a chemical etchant;
    removing a conductive material plated onto an uppermost surface of the down-set portion by chemical etching; and
    filling a void left by removing the conductive material and the lower section of the down-set portion of the die-attach paddle with epoxy.

7. The method of claim 6, wherein bonding a second end of the lead wire to a lead finger of the electrical package includes bonding the second end of the lead wire to a pin of a quad flat pack.

8. The method of claim 6, wherein bonding a first lead wire includes bonding the first lead wire to a copper down-set portion of the die-attach paddle.

9. The method of claim 6, comprising silver plating an uppermost portion of the die-attach paddle.

10. A method for attaching an integrated circuit die to an electrical package, comprising:
    adhering the integrated circuit die to an uppermost portion of a die-attach paddle, the die-attach paddle including a down-set portion on a periphery of the die-attach paddle;
    bonding a first end of a lead wire to the integrated circuit die;
    bonding a center portion of the lead wire to the down-set portion of the die-attach paddle;
    bonding a second end of the lead wire to a lead finger of the electrical package; and
    encapsulating the integrated circuit die and die-attach paddle, including leaving a section of the down-set portion exposed.

11. The method of claim 10 further comprising plating an uppermost portion of the die-attach paddle with an electrically conductive material.

12. A method for attaching an integrated circuit die to an electrical package, comprising:
    adhering the integrated circuit die to an uppermost portion of a die-attach paddle, the die-attach paddle being selected to have a down-set portion on a periphery of the die-attach paddle;
    bonding a first end of a lead wire to the integrated circuit die;
    bonding a center portion of the lead wire to the down-set portion of the die-attach paddle;
    bonding a second end of the lead wire to a lead finger of the electrical package;
    encapsulating the integrated circuit die and die-attach paddle;
    masking any exposed lowermost section of the down-set portion of the die-attach paddle;
    plating an exposed area of the lead finger;
    unmasking the lowermost section of the down-set portion of the die-attach paddle;
    removing a lower section of the down-set portion of the die-attach paddle with a chemical etchant;
    removing a conductive material plated onto an uppermost surface of the down-set portion by chemical etching; and
    filling a void left by removing the conductive material and the lower section of the down-set portion of the die-attach paddle with epoxy.

13. The method of claim 12, wherein bonding a second end of the lead wire to a lead finger of the electrical package includes bonding the second end of the lead wire to a pin of a quad flat pack.

14. The method of claim 12, wherein bonding a first lead wire includes bonding the first lead wire to a copper down-set portion of the die-attach paddle.

15. The method of claim 12, comprising silver plating an uppermost portion of the die-attach paddle.

16. A method for attaching an integrated circuit die to an electrical package, comprising:
    attaching the integrated circuit die to an uppermost portion of a die-attach paddle;
    attaching a first lead wire portion from the integrated circuit die to a down-set portion on a periphery of the die-attach paddle;
    attaching a second lead wire portion from the down-set portion of the die-attach paddle to a lead of the electrical package;
    encapsulating the integrated circuit die and the die-attach paddle;
    masking a lowermost section of the down-set portion of the die-attach paddle;
    plating an exposed area of the lead finger;
    unmasking the lowermost section of the down-set portion of the die-attach paddle;
    etching away a lower section of the down-set portion of the die-attach paddle;
    etching a conductive material plated from an uppermost surface of the down-set portion; and
    filling, with epoxy, a void left by removing the conductive material and the lower section of the down-set portion of the die-attach paddle.

17. The method of claim 16, comprising plating an uppermost portion of the die-attach paddle with an electrically conductive material.

18. The method of claim 16, wherein attaching the first lead wire portion includes bonding a first lead wire from the integrated circuit die to the down-set portion of the die-attach paddle, and wherein attaching the second lead wire portion includes bonding a second lead wire from the down-set portion of the die-attach paddle to a lead finger of the electrical package.

19. The method of claim 16, wherein attaching the first lead wire portion includes bonding a first end of a lead wire to the integrated circuit die and bonding a center portion of the lead wire to the down-set portion of the die-attach paddle.

20. The method of claim 16, wherein attaching the second lead wire portion includes bonding a center portion of a lead wire to the down-set portion of the die-attach paddle and bonding a second end of the lead wire to a lead finger of the electrical package.

21. The method of claim 16, wherein attaching the first lead wire portion and attaching the second lead wire portion each include:
    bonding a first end of a lead wire to the integrated circuit die;
    bonding a center portion of the lead wire to the down-set portion of the die-attach paddle; and
    bonding a second end of the lead wire to a lead finger of the electrical package.

22. The method of claim 16, wherein encapsulating the integrated circuit die and die-attach paddle includes leaving a section of the down-set portion exposed.

* * * * *